(12) United States Patent
Eggenkamp et al.

(10) Patent No.: US 7,790,589 B2
(45) Date of Patent: Sep. 7, 2010

(54) METHOD OF PROVIDING ENHANCED BREAKDOWN BY DILUTED DOPING PROFILES IN HIGH-VOLTAGE TRANSISTORS

(75) Inventors: Paulus J. T. Eggenkamp, Rosmalen (NL); Priscilla W. M. Boos, Molenhoek (NL); Maarten Jacobus Swanenberg, Nijmegen (NL); Rob Van Dalen, Bergeijk (NL); Anco Heringa, Waalre (NL); Adrianus Willem Ludikhuize, Valkenswaard (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 11/742,404

(22) Filed: Apr. 30, 2007

(65) Prior Publication Data

US 2008/0265319 A1      Oct. 30, 2008

(51) Int. Cl.
*H01L 21/22* (2006.01)
*H01L 21/38* (2006.01)

(52) U.S. Cl. .................. 438/549; 438/548; 438/552; 257/E21.427

(58) Field of Classification Search .......... 438/548, 438/549, 552; 257/327, 328, 337, 341, 492, 257/493, 335, 339, 343, 487, E21.427
See application file for complete search history.

(56) References Cited

U.S. PATENT DOCUMENTS

| | | | |
|---|---|---|---|
| 5,473,180 A * | 12/1995 | Ludikhuize | 257/336 |
| 6,614,089 B2 * | 9/2003 | Nakamura et al. | 257/492 |
| 6,677,627 B2 * | 1/2004 | Miida | 257/292 |
| 6,777,746 B2 * | 8/2004 | Kitagawa et al. | 257/335 |
| 6,853,034 B2 * | 2/2005 | Matsuzaki et al. | 257/343 |
| 6,882,023 B2 * | 4/2005 | Khemka et al. | 257/493 |
| 6,888,210 B2 * | 5/2005 | Jeon et al. | 257/492 |
| 6,909,143 B2 * | 6/2005 | Jeon et al. | 257/335 |
| 2002/0153556 A1* | 10/2002 | Rumennik et al. | 257/325 |

* cited by examiner

*Primary Examiner*—Shouxiang Hu

(57) ABSTRACT

A method of fabricating high-voltage semiconductor devices, the semiconductor devices and a mask for implanting dopants in a semiconductor are described.

20 Claims, 11 Drawing Sheets

METHOD OF PROVIDING ENHANCED BREAKDOWN BY DILUTED DOPING PROFILES IN HIGH-VOLTAGE TRANSISTORS

CROSS-REFERENCE TO RELATED APPLICATIONS

The present application is a continuation of International Patent Application WO/IB2006/0539 to Adrianus W. Ludikhuize, et al., filed on Oct. 22, 2006, which in turn claims priority from European Patent Application No. 05110255.6 filed on Nov. 2, 2005. The present application is also related to U.S. patent application Ser. No. 11/742,375 to Adrianus Ludikhuize, et al, and filed on even dated herewith. Priority is hereby claimed under 35 U.S.C. §365(c) and 35 U.S.C. §120 from the referenced International Patent Application. The disclosures of these cross-referenced patent applications are specifically incorporated herein by reference.

BACKGROUND

Power devices are electronic components designed for use in the comparatively high voltage and high current applications. These devices may be implemented in widely varying applications to include lighting, automotive, consumer and appliance applications. Power devices include semiconductor devices that are adapted to function at high voltage and high current. One type of semiconductor device that is often implemented in power devices is power lateral double-diffused metal-oxide-semiconductor (LDMOS) field-effect-transistor (FET) device, referred to herein as a power LDMOS device. Another type of semiconductor device that is often implemented in such applications is a lateral High-Voltage MOSFET (HVFET).

As power technologies develop, power applications require power LDMOS devices to be cheaper and smaller in physical size. Often, the demands on the reduced size do not relax the power requirements; rather the power requirements may be the same or even increased. Moreover, there is a need to provide these devices with a comparatively high breakdown voltage ($V_{BD}$), depending on the application. One LDMOS device adapted to provide the high breakdown voltage requirement combined with good on-state properties includes a reduced surface field (RESURF) structure. A power LDMOS or HVFET device having a RESURF structure comprises a first semiconductor region, which serves as a RESURF drift region, having one conductivity type; and a second semiconductor region, which serves as a charge balance region, having a different conductivity type. Moreover, the LDMOS and HVFETs may have one or a plurality of channels in the drift region of the device.

As is known, high-voltage devices are usefully self-terminated in order to avoid premature breakdown at the edges of the device. This self-termination implies that the layout of the device contains curved as well as straight sections. The drain is placed in the center of the layout, and the source is at the edge. Drain and source may however be interchanged. Similarly, in the case of a high-voltage diode, either the cathode or the anode can be placed in the center of the layout. Moreover, the drain extensions are designed to reduce the electric field, or spread the electric potential, between source and drain as much as possible. Near the drain and source, however, the proximity of another drain extension from a next finger forces the potential lines to curve and the lateral electric field to change its direction over a relatively short distance. This results in a peak in the electric field (known as the cylindrical effect), which reduces the breakdown voltage. At the fingertips of an interdigitated power device the adverse effects of electric field concentration (known as the spherical effect) are even stronger and the breakdown voltage is even further reduced. This situation also depends on the actual dopant distribution in the device.

One known technique designed to decrease the electric field is to enlarge the distance between both sides of the drain extensions of an extended drain structure. However, this requires an increased device area, which is counterproductive to the desired goal of reduced physical size of devices and cost of components.

There is a need, therefore, for a method of fabricating power semiconductor devices that overcomes at least the shortcomings and disadvantages of the known methods described.

SUMMARY

In accordance with an illustrative embodiment, a method of manufacturing an extended drain of a high voltage field-effect (HVFET) transistor with a RESURF structure and multiple conduction paths includes: a) implanting a first dopant in a substrate of a first conductivity type to form a first region of a second conductivity type in the substrate; b) providing a mask having an open portion in the center, and a plurality of outer open portions and blocking portions disposed between the center and the edge adjacent to a drain; c) implanting a second dopant into the substrate at a surface to form a second region of the first conductivity type, the second region having a region of reduced doping concentration between the center portion and the edge; d) forming an epitaxial layer of the first conductivity type on the surface layer, wherein the surface layer is covered by the first epitaxial layer; and e) implanting the epitaxial layer with a third dopant and forming a third region of the second conductivity type in the epitaxial layer, wherein this third region forms a pn junction with the second region.

In accordance with a representative embodiment, a mask for implanting at least the second dopant in a semiconductor includes an open portion over a center portion and a plurality of outer open portions and blocking portions disposed between the center portion and an edge. The outer open portions and blocking portions are adapted to provide a doping profile having a diminishing doping concentration between the center portion and the edge.

In accordance with yet another representative embodiment, a high voltage metal oxide semiconductor device includes a substrate of a first conductivity type; a source region of a second conductivity type; a channel region having a body-region of the first conductivity type disposed around the source region; a drain region of the second conductivity type. The device further includes a first region of the second conductivity type disposed in the substrate; a second region of the first conductivity type substantially disposed at a surface, wherein the first region and the second region form a pn junction. An epitaxial layer of the first conductivity type is disposed over the substrate with a third region of the second conductivity type disposed therein. An extended drain extends between the body and the drain region, wherein the first, second and third regions extend between the drain and the source. The device further includes at least one region having a diluted doping concentration.

BRIEF DESCRIPTION OF THE DRAWINGS

The representative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

In the following detailed description, for purposes of explanation and not limitation, specific details are set forth in order to provide a thorough understanding of example embodiments according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of apparati, devices, materials and methods known to one of ordinary skill in the art may be omitted so as to not obscure the description of the example embodiments. Such apparati, devices, methods and materials are clearly within the scope of the present teachings.

The methods of representative embodiments described herein are not limited to Si substrates; and are applicable to other semiconductor materials including, but not limited to: SiC, Ge, SiGe, InP, GaAs, GaN. In general, the RESURF principle of the present teachings may be applied to the formation of pn junctions in a semiconductor substrate. Moreover, the methods of the representative embodiments are applicable to the fabrication of other semiconductor devices, including, but not limited to diodes. Finally, the noted doping and dopants to achieve the doping described to arrive at the devices are merely illustrative. For example, rather than the p-type substrate and alternating n,p layers as described, an n-type substrate with alternating p, n layers may be fabricated in accordance with the present teachings.

Figure 1:
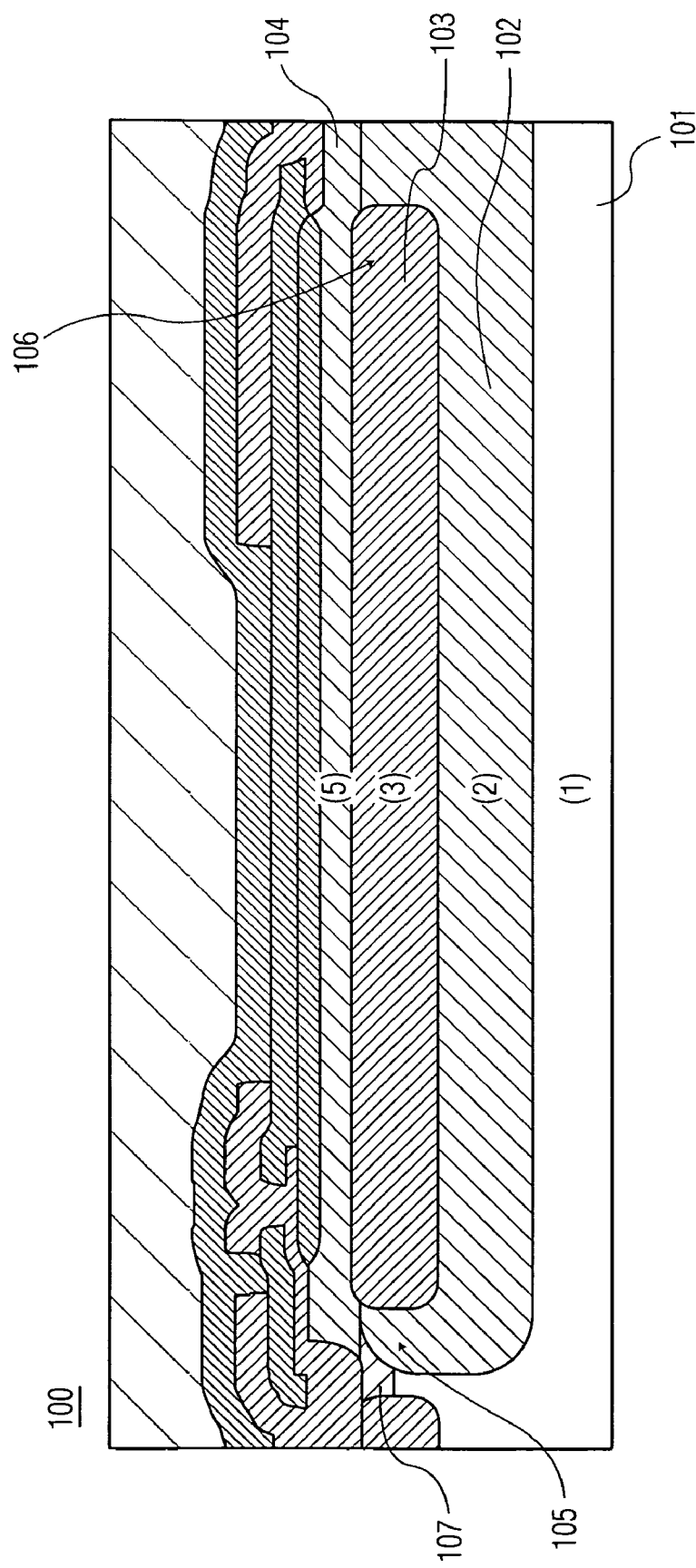
FIG. 1 is a cross-sectional view from source to drain of an HV-MOSFET having an extended drain in accordance with a representative embodiment.

FIG. 1 is a cross-sectional view of an HV-MOSFET 100 in accordance with a representative embodiment. The HV-MOSFET shares many features with those described in the cross-referenced patent applications. As such, many details are not repeated to avoid obscuring the description of the representative embodiments. The HV-MOSFET 100 is disposed over a p-type substrate 101 and includes an n-type region 102 formed by implantation and diffusion; and a p-type (Resurf P or RP) region 103 formed by implantation at the surface. A p-type epilayer 107 is grown over the substrate including regions 102 and 103, and an n-type well 104 is formed in the epilayer 107 by implantation. As will be appreciated, the n-type regions 102, 104 provide the conductive extended drain regions and region 103 provides the RESURF action together with the substrate 109. Thereafter known processing steps for fabricating a Lateral DMOS transistor are performed to complete the fabrication of the device.

The HV-MOSFET 100 includes diluted regions with a reduced doping concentration obtained by using masks of representative embodiments described herein. To this end, the masks are less transparent over locations 105 in region 102 and 106 in region 103 in the extended drain, among other locations. These regions 105, 106 are formed during the implantation of the extended drain (p-type region 103 and n-type region 102). Near the drain, this is achieved by reducing the p-type dope in layer 103 and near the source by reducing the n-type dope in layer 102 or 104.

As described more fully herein, a reduced doping level results in more effective potential spreading (and reduced electric field as later shown by arrows in FIG. 3) in the regions close to the drain. This provides improved breakdown voltages ($V_{BD}$) without having to increase the drain area between extended drain regions. Close to the source, the region 103 must be interrupted in order to allow current from region 104 to 102; here the dose of region 102 must be reduced in order to prevent premature breakdown, as described in the concurrently filed cross-referenced application to Ludikhuize, et al. Moreover, at the drain the region 103 must be interrupted to allow current from region 104 to region 102 and to the drain contact; this may require a correction of the local dopant levels as well. As noted, increasing the layout of the device to decrease the adverse effect of electric field strength on $V_{BD}$ increases the size of devices and components, among other shortcomings.

Figure 2:
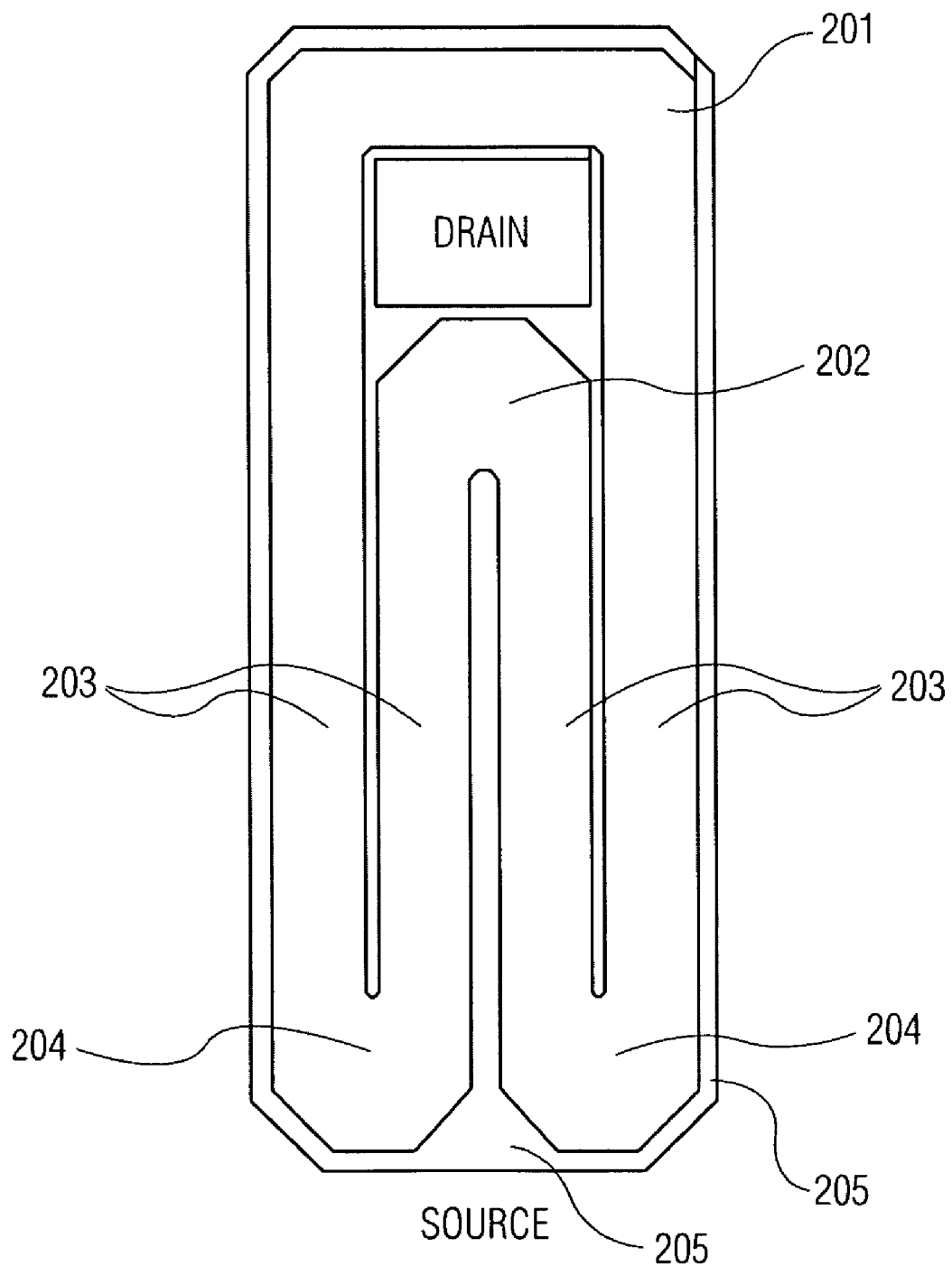
FIG. 2 is a top view of an interdigitated HV-MOSFET having an extended drain in the center in accordance with representative embodiment.

FIG. 2 is a top-view of an interdigitated HV-MOSFET in accordance with a representative embodiment, having the drain in the center. The HV-MOSFET includes a drain corner having a quarter curve 201 at the drain bonding pad, a source finger tip 202 having a halve curve disposed adjacent to the drain, active parallel regions of drain and source without curves 203 and drain finger tips 204 having a halve curve 205 disposed adjacent to the source. In this example, the drain is placed in the center of the layout, and the source is at the edge. Notably, the drain and source may be interchanged. Similarly, in embodiments of a high-voltage diode, either the cathode or the anode can be placed in the center of the layout. Notably, the layout of a 'small' transistor is shown, having only two fingers. In a power device, the number of fingers can be as large as 20 or more. Each drain finger tip 204 and each source finger tip 202 should have the same doping profile, but the doping profiles of the source finger tips can be different than the doping profiles of the drain finger tips.

As described in the cross-referenced applications, in high voltage devices, the drain extensions are designed to spread the electric fields between source and drain. Near the drain and source, however, the proximity of another drain extension from the other half of the finger forces the potential lines to curve and the lateral electric field to change direction over a relatively short distance (cylindrical effect). This causes the electric fields to increase near the drain or source diffusion. At the source and drain finger tips 202, 204, this effect is further enhanced because the electric fields also have to follow the curvature of the structure (spherical effect). Hence the electric field strength is even greater at the tips of the fingers than in the 'straight' sections, and as a consequence the breakdown voltage in the finger tips is lower than the breakdown voltage in the straight sections of the device. In the representative embodiments described herein, the diluted regions 105, 106 are adjacent to or in proximity to the source and drain, and adjacent to or in proximity to the finger-tips (not shown in FIG. 2) result in reduced carrier density in the regions of the drain and source and a reduced electric field concentration or strength. Ultimately, this improves the $V_{BD}$ of the device.

Figure 3A:
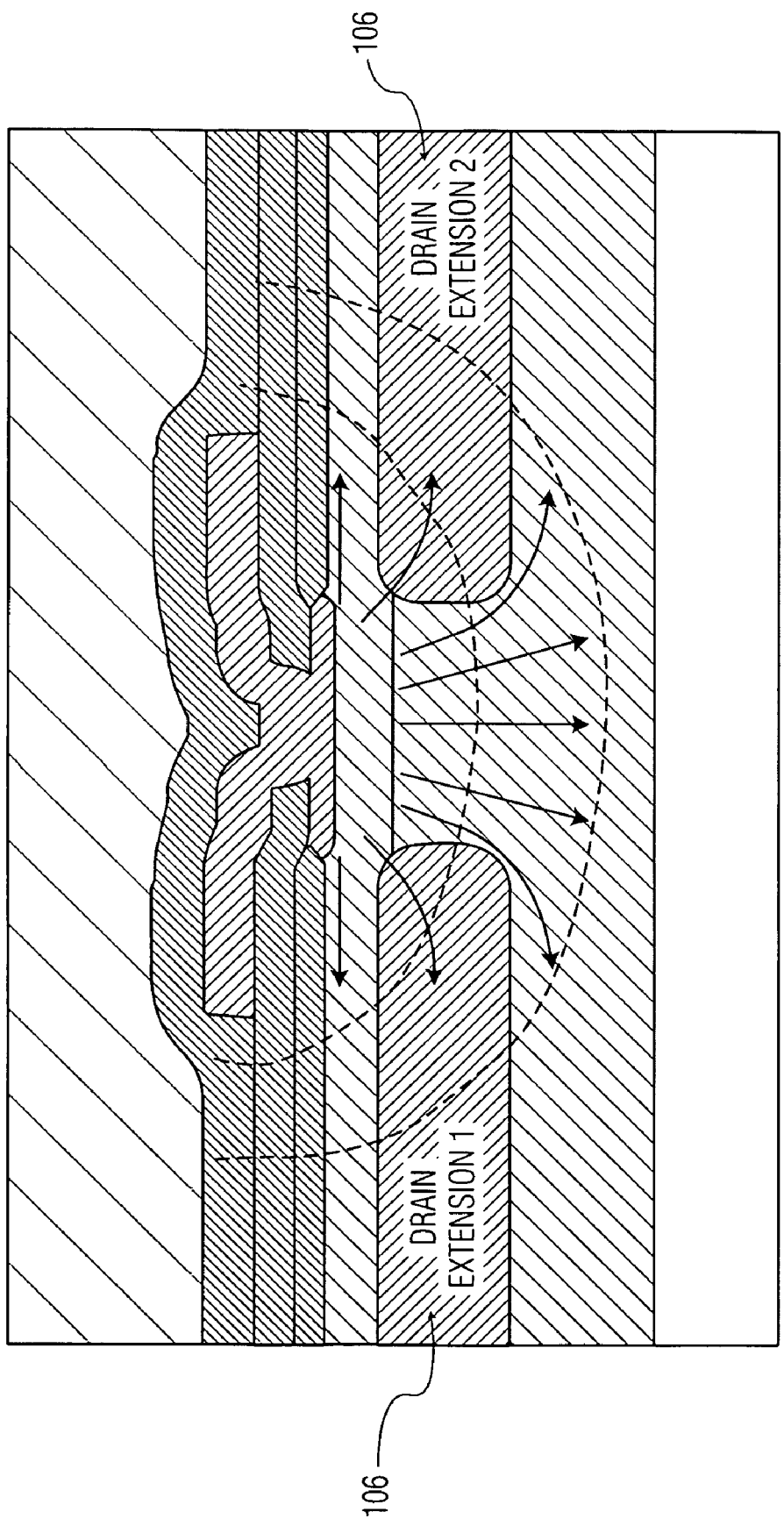
FIG. 3A is a cross-sectional detailed view at the drain of an HV-MOSFET having an extended drain in accordance with a representative embodiment.

FIG. 3A is a detailed cross-section at a drain finger in the active (parallel) region of an interdigitated device. Due to the small size of the drain contact area, the potential lines (dashed) are curved, which enhances the electric field and lowers the $V_{bd}$ of the device due to the cylindrical effect.

Figure 3B:
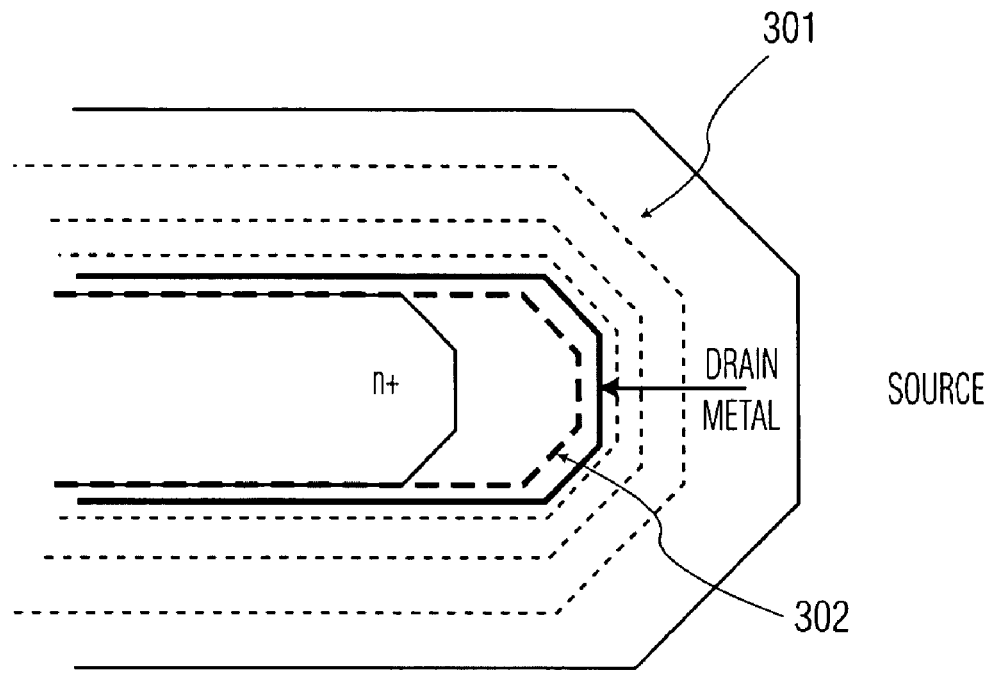
FIGS. 3B-3D are conceptual top views at drain finger-tips of an HV-MOSFET showing equipotential lines.

FIG. 3B is a conceptual top view at a drain finger-tip region 204 of an interdigitated device. Equipotential (dashed) lines 301 around the curved end of the RP region 302 at the drain are comparatively crowded and show the spherical effect and also the cylindrical effect. This arrangement results in a lowered $V_{bd}$.

Figure 3C:
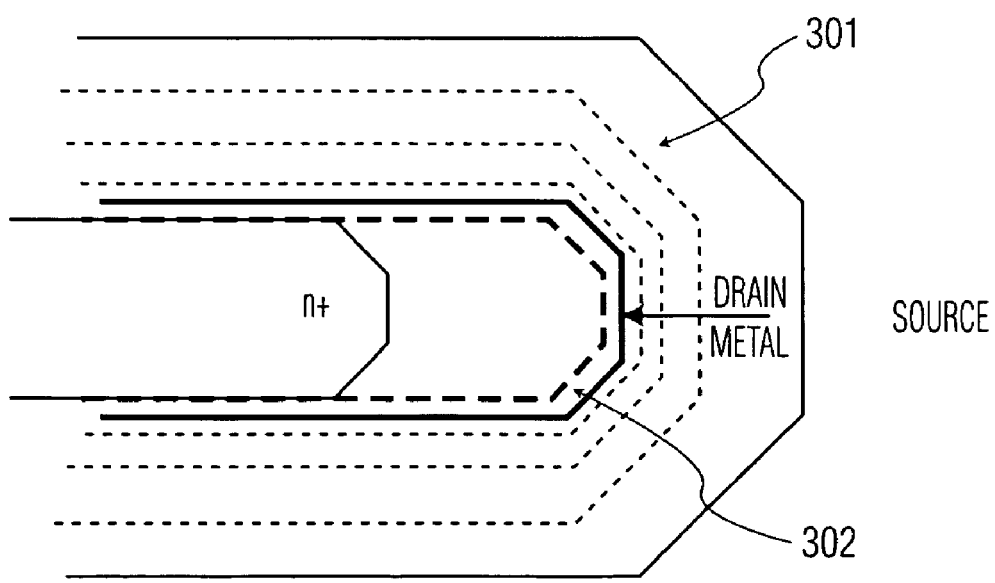

FIG. 3C is a conceptual top view at a drain finger-tip region 204 of an interdigitated device. Equipotential lines 301 around the curved end of the RP region 302 remain comparatively crowded in spite of the stretching of the RP region 302 from the heavily doped (n+) drain region and the drain metal. The spherical effect and the cylindrical effect again result in a lowered $V_{bd}$.

Figure 3D:
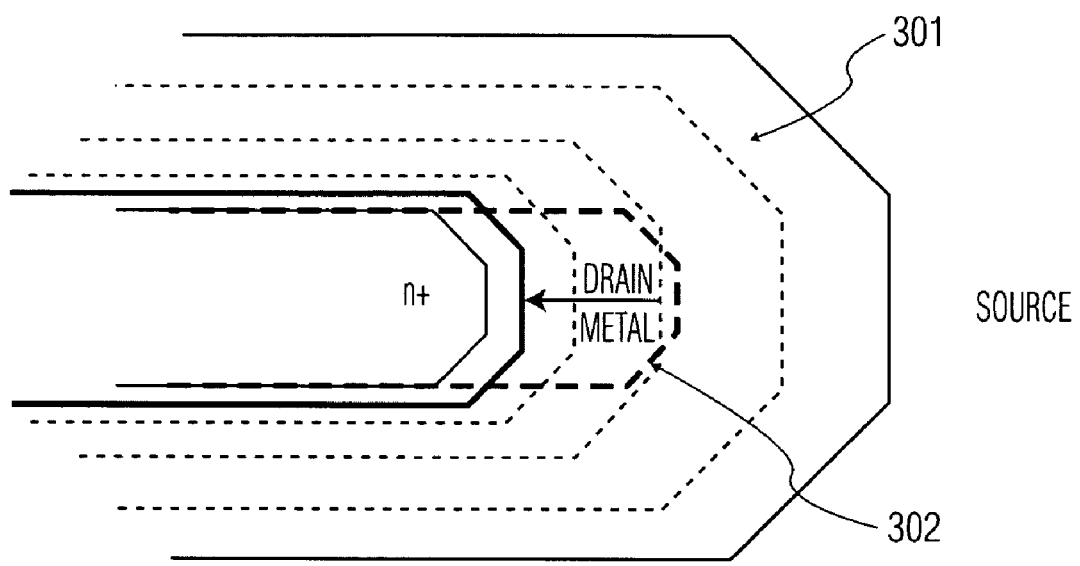

FIG. 3D is a conceptual top view at a drain finger-tip region 204 of an interdigitated device of a representative embodiment. Equipotential lines 301 around the curved end of a diluted RP region 303 are beneficially comparatively spread out. As a result $V_{bd}$ is comparatively higher.

As will be appreciated, the diluted regions (e.g., 105, 106) of the representative embodiments reduce the vulnerability for charge imbalance, by reducing the electrical fields in the area that is weak for the particular imbalance. Dilution in the p-layer for one side of the imbalance and dilution in the n-layer(s) for the other side of the imbalance is appropriate.

Figure 4A:
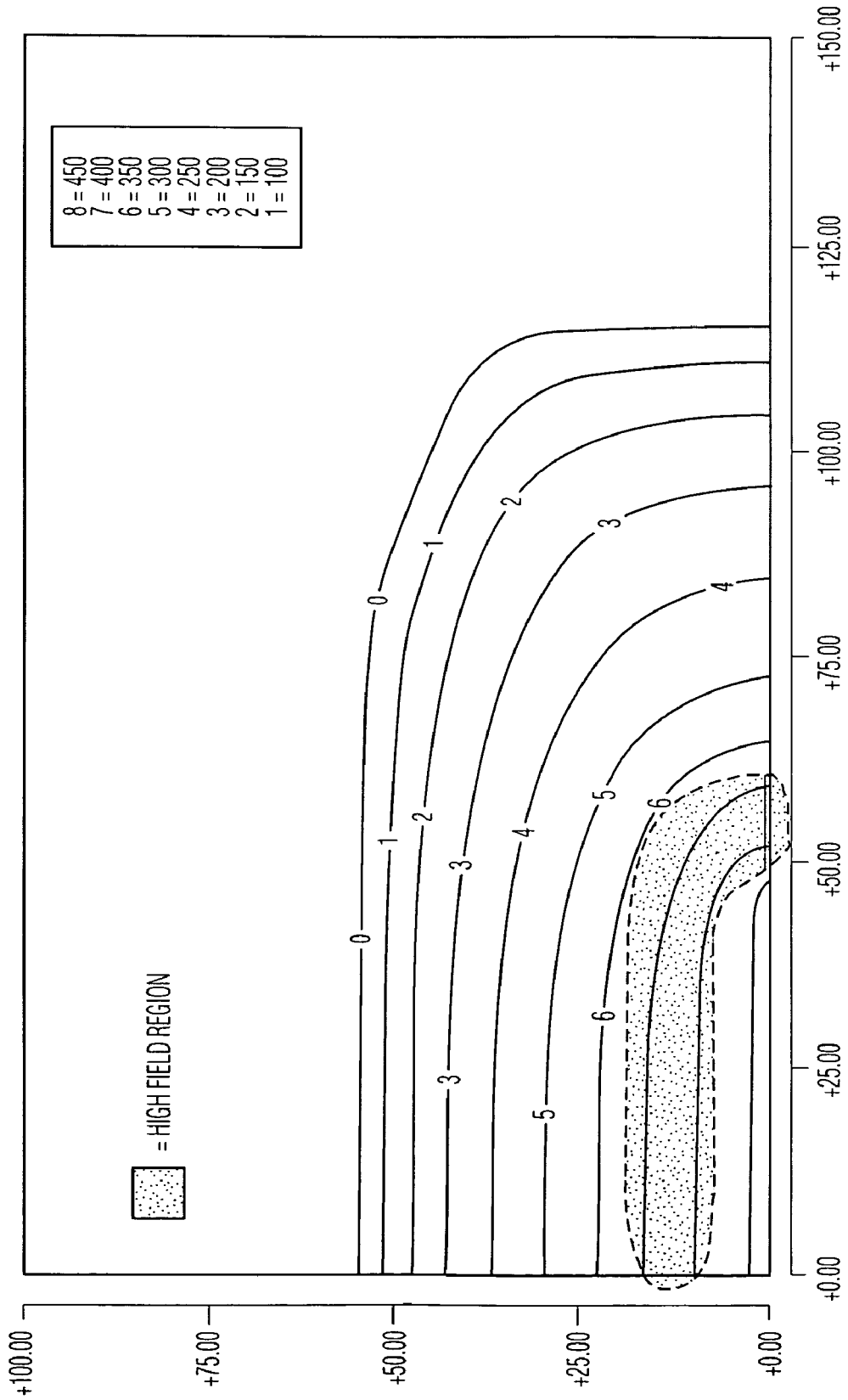
FIGS. 4A and 4B are examples of 3-D simulations at the drain finger-tip
Figure 4B:
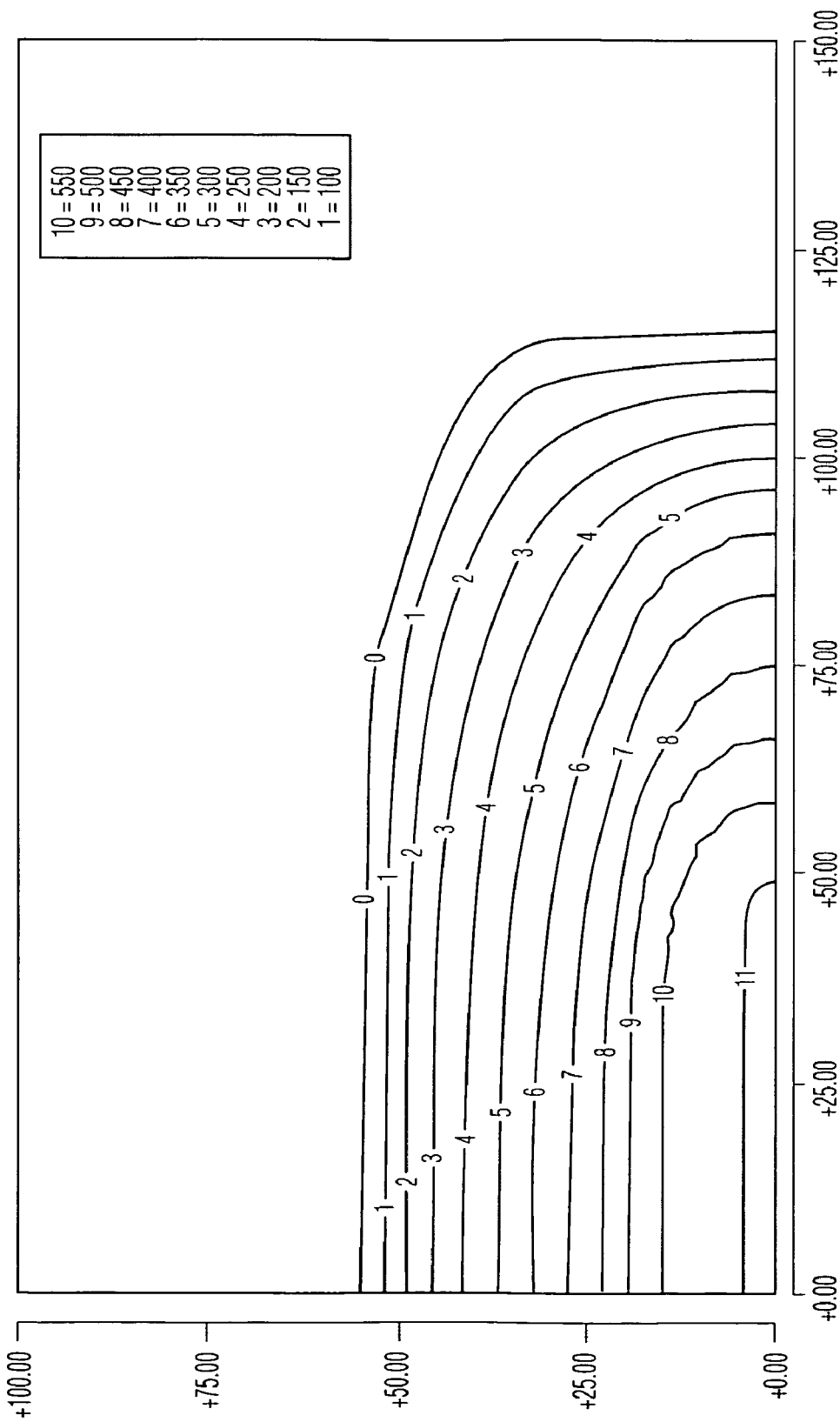

FIGS. 4A-4B are top view results of two three-dimensional device simulations at the drain finger-tip. FIG. 4A shows the result of the existing situation from a device without dilution regions, indicating a strongly enhanced electric field at the finger-tip related with a lowered breakdown voltage. The electric fields are enhanced by curvature effects at the parallel drain edge (cylindrical effect) and drain finger-tip (spherical effect)

FIG. 4B shows the result of an improved situation obtained by a proper local dopant dilution of the RP-region of a representative embodiment, using an illustrative mask blocking pattern for its implantation. Notably the electric field is reduced by local dopant reduction at the parallel drain edge and at the drain finger-tip in accordance with a representative embodiment. From these simulations it was determined that the dopant reduction to achieve improved breakdown is needed over a comparatively considerable length. Illustratively, this doping reduction should be over approximately 10 μm to approximately 15 μm (for a 550V rating). Moreover, the reduction of dopant concentration is also comparatively large: illustratively approximately 25% of the typical dose, which translates to a correction approximately $1.5 \times 10^{12}$ cm$^{-2}$.

In a representative embodiment, the concentration of the p-type dopant in a 'straight' section of layer 103 (e.g., the drain extensions 203) changes substantially linearly from full (relative) concentration in the center of the drain extension to between approximately 70% and approximately 90% near the drain contact. The length over which this decrease is designed is between approximately 10% and approximately 50% of the length of the drain extension. At the drain contact, an opening must be provided in the p-type layer 103 to allow the current from the n-type layer 102 to reach the drain contact.

As noted previously, in the source and drain finger tips of the device, the electric fields are focused even more than in the 'straight' sections. Therefore, the dopants in layer 102, 103 or 104 are beneficially reduced over a longer distance to reduce the peak in the electric field.

Figure 5A:
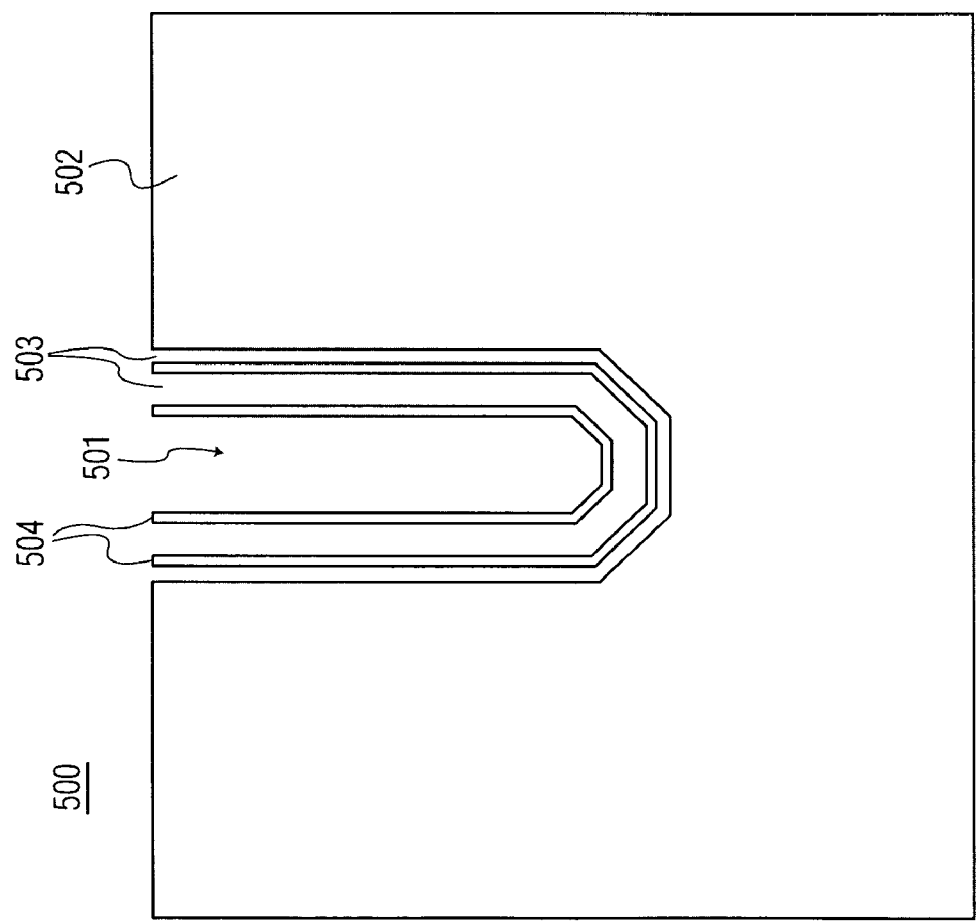
FIGS. 5A, 5B and 5C are partial views of implantation masks in accordance with the representative embodiment.
Figure 5B:
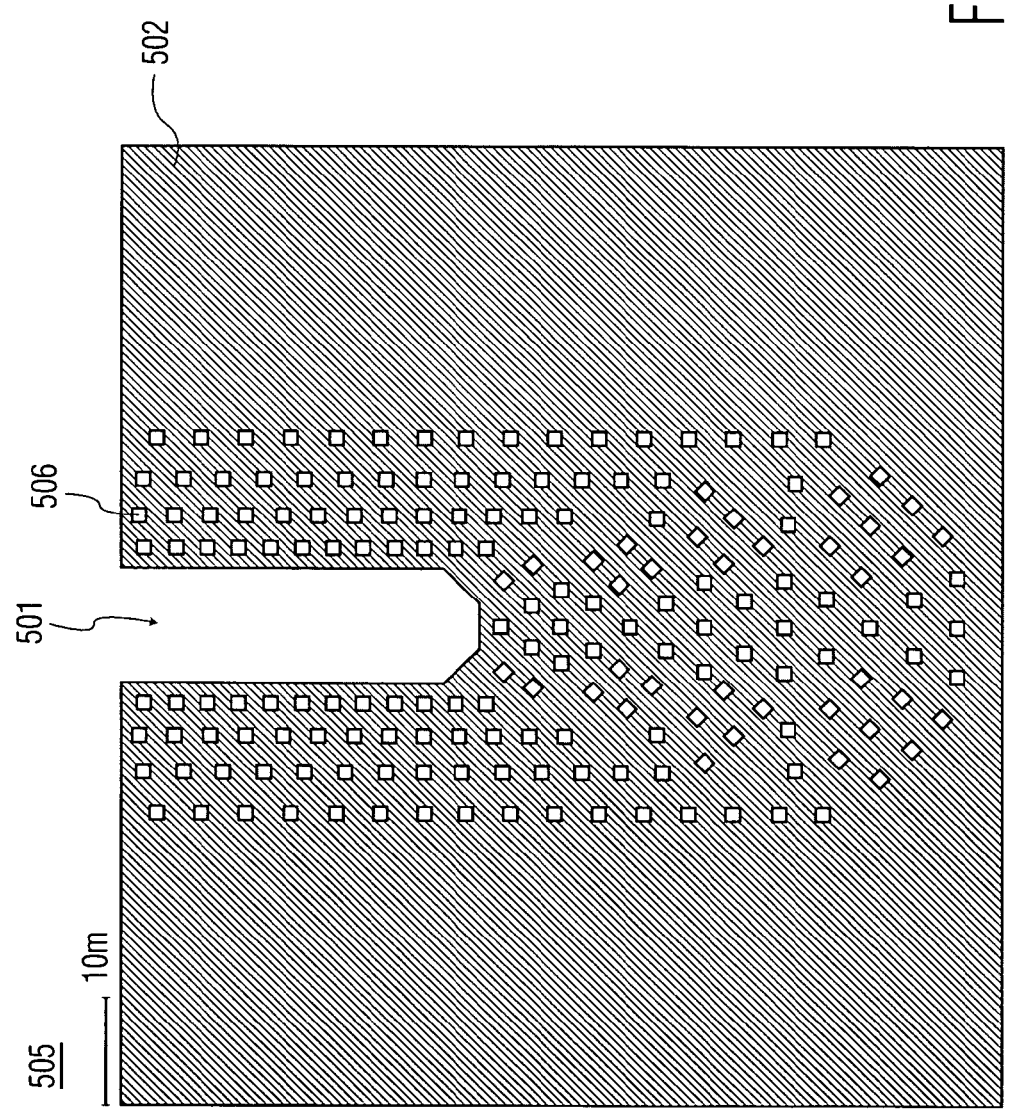

FIGS. 5A and 5B are top-views of portions of implantation masks for the second implantation providing region 2 (RP), in accordance with representative embodiments. Regions near the drain, in the center of FIGS. 5A and 5*b*, indicate a blocking of the implantation. The masks are fabricated by methods and using material within the purview of one of ordinary skill in the art.

A portion of a mask 500 is shown in FIG. 5A and is provided over the semiconductor wafer in a region near the drain finger tip in keeping with the representative embodiments of FIG. 1. The mask 500 includes an outer portion 502 and inner portions 504, which are substantially transparent to dopants. The mask 500 also includes inner portions 501, 503, which are substantially opaque (or blocking) to dopant atoms. Also close to the source (not shown in FIG. 5A) the mask 500 provides blocking in order to allow for current from layer 104 to layer 102. As will be appreciated, during an implantation sequence, the blocking portions prevent dopants from significantly being implanted in the wafer; and the open portions allow the dopants to be implanted.

A portion of another mask 505 is shown in FIG. 5B. The mask 505 is provided over the semiconductor wafer in a region near the drain finger tip in keeping with the representative embodiments of FIG. 2. The mask 505 includes an inner portion having the blocking portion 501 and an outer portion having an open portion 502. In addition, the mask 505 includes a plurality of blocking portions 506 having a selected geometrical shape. The patterning of the mask allows a finer control of the dopant during implantation. Instead of or in addition to squares, one can also use other geometries like rectangles, triangles, diamonds, circles, ovals may be used.

Figure 5C:
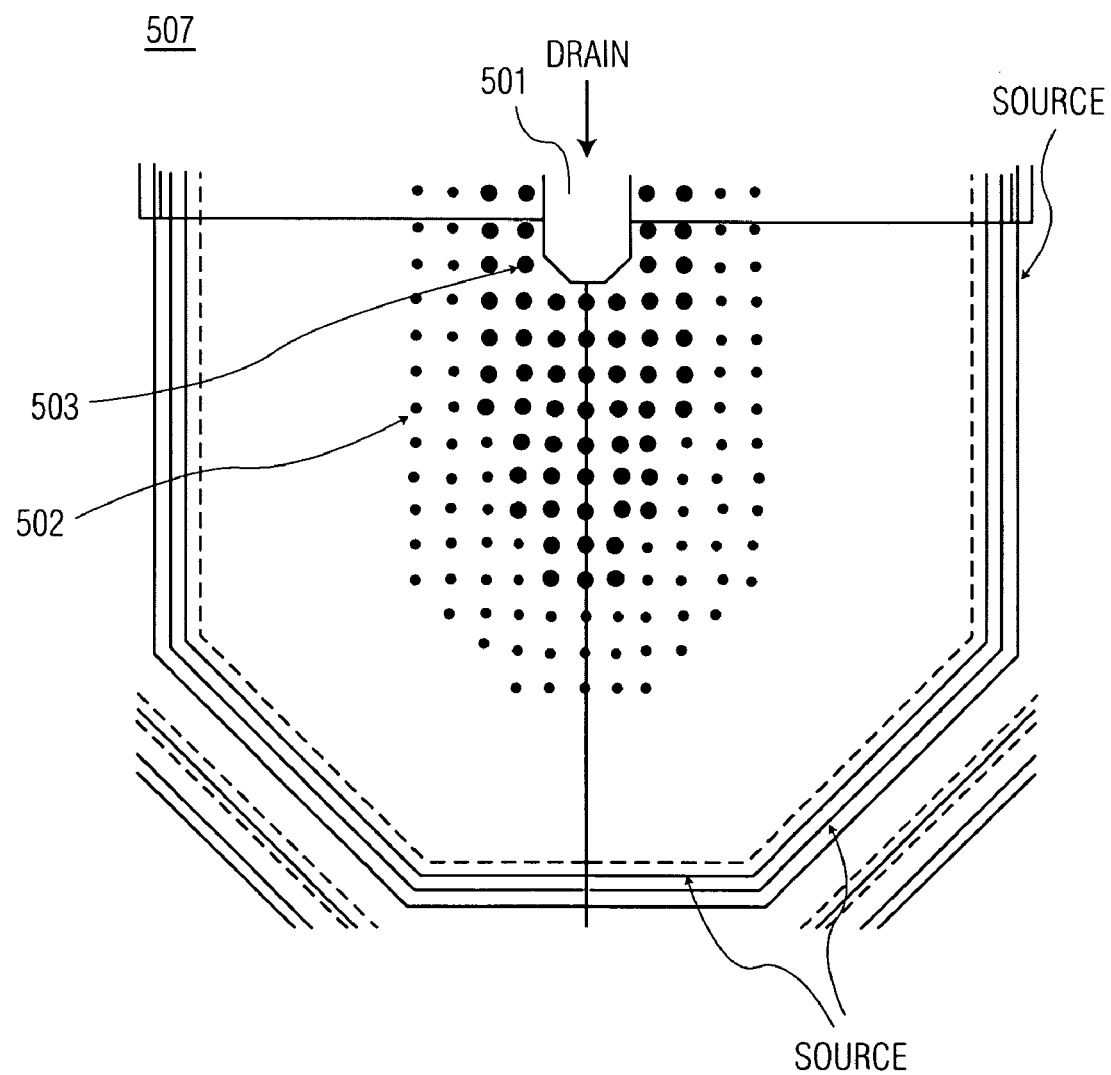

FIG. 5C is another top-view example of an implantation mask for the second implant providing region 2 (RP), in accordance with a representative embodiment. The mask is fabricated by methods and using material within the purview of one of ordinary skill in the art.

FIG. 5C shows a portion of a mask 507 for implanting a semiconductor wafer in a region near the drain finger tip in keeping with the representative embodiments of FIG. 1. The inner portion includes a blocking portion 501 near the drain and an outer portion having blocking portions 502 (dark) and open portions 503. Beneficially, the various blocking portions 503 have a different size, with the size of the portions 503 increasing towards the drain. Also close to the source the mask 505 provides blocking in order to allow for current from the first region to the third region (not shown in FIG. 5C). As will be appreciated, during an implantation sequence, the blocking portions prevent dopants from significantly being implanted in the wafer; and the open portions allow the dopants to be implanted.

Among other benefits, the patterning of the mask allows a finer control of the dopant during implantation. Instead of or in addition to squares, one can also use other geometries like rectangles, triangles, diamonds, circles, ovals may be used.

Use of the mask 500, 505 or 507 allows a tailoring of the dopant concentration in regions around the drain (or source, if applied to another mask layer) and in proximity to the finger tips as described above. Notably, the dopant concentration can be reduced abruptly, non-linearly or linearly in the diluted regions 105, 106. To make the device more robust against processing variations, the change in the doping concentration in the diluted regions 105, 106 may be made more gradual via the masks 500, 505 or 507. As such, if the implantation is of 'target', the electric fields only shift slightly inside the drain extension, whereas if the dopes are not diluted the potential lines will shift substantially, resulting in enhanced electric fields and a lower $V_{bd}$.

To obtain a more gradual change in the dopant concentration, the blocking portions 503 on the mask 500 are more densely spaced towards the drain contact, and are gradually spaced apart further towards the center of the drain extension. This same effect can be achieved by adjusting the widths of the blocking portions while keeping the distances constant.

Similarly, on the mask 505, the blocking portions 506 are more densely spaced towards the drain contact, and are gradually spaced apart further towards the center of the drain extension.

Within the patterns of mask 500, there are a number of parameters that can be varied. In a line pattern the width and spacing of each of the lines (e.g., 503, 504) can be tuned to achieve the optimal result. Using a constant width and spacing, a step-like reduction (i.e., abrupt reduction) of the dopant is realized.

When using geometrically shaped (e.g., squares as shown) blocking portions to pattern the masks 505, 507, the size of the squares, as well as the distance and alignment between the squares in both directions can be varied independently. The effect on the electric fields is similar as when using only blocking portions 503, however greater flexibility in design is fostered in order to achieve the desired (higher) breakdown voltage.

Figure 6:
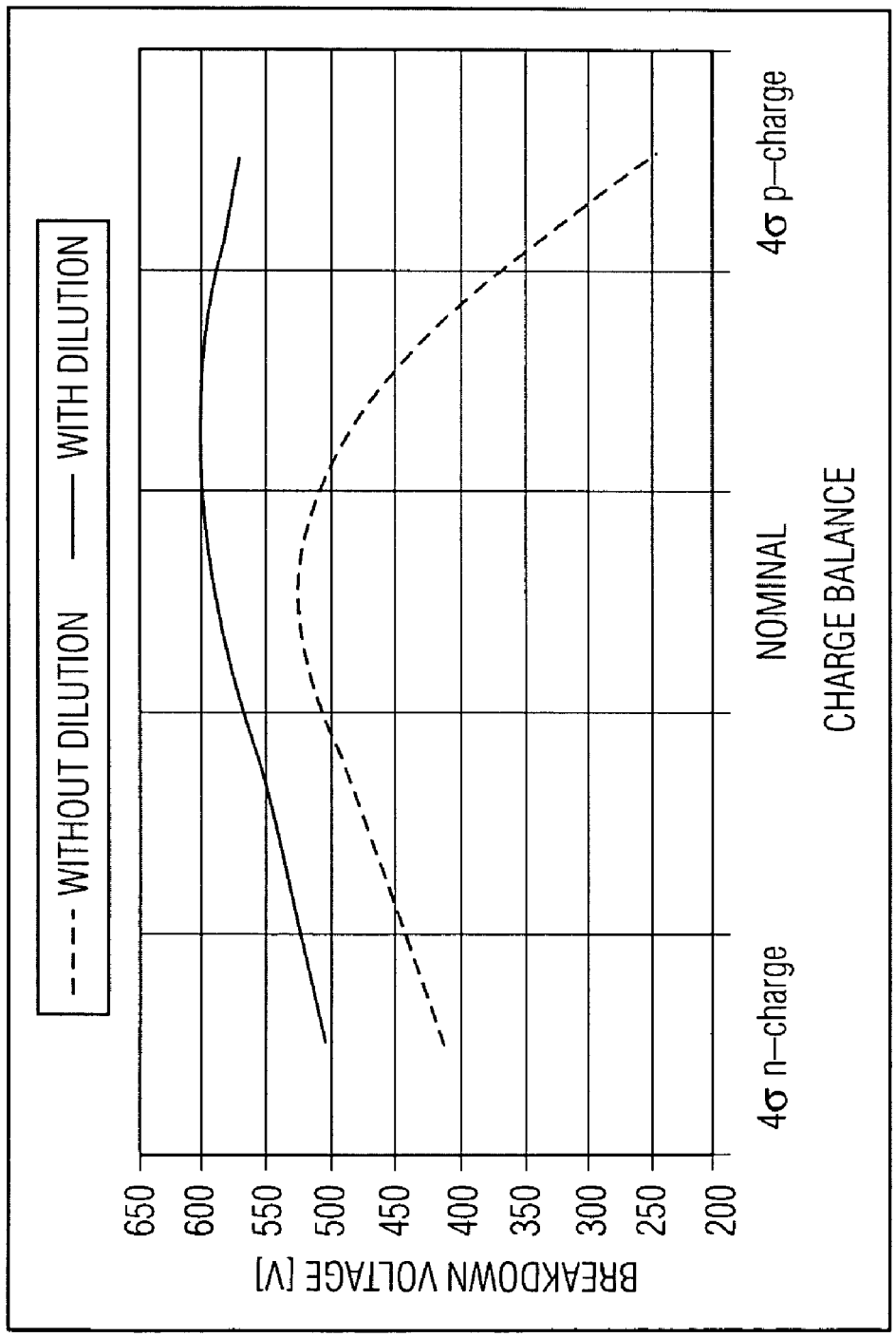
FIG. 6 is a graphical representation of breakdown voltage versus charge balance of an LDMOSFET in accordance with a representative embodiment.

FIG. 6 is a graphical representation of the measured breakdown voltage versus RESURF charge balance for a known device (without diluted regions; dashed line) and for a device according to a representative embodiment (solid line). As is known, if the implantation dose of one of the layers 102, 103 or 104 is off target, the breakdown voltage may be strongly decreased. This is denoted by the RESURF charge balance, which is calculated by subtracting the total n-type dose from the total p-type dose including the depletion charge in the substrate. For an optimal performance of the device, the charge balance should be close to zero. If the charge is off-balance the electric fields in the drain extension will redistribute and focus near the drain or source of the devices. In case there is more n-type charge in the drain extension, the breakdown occurs close to the source side of the drain extension; otherwise if there is more p-type charge, the breakdown occurs close to the drain side of the drain extension. Here, the charge balance is indicated in terms of the normal process spread σ. In a representative embodiment, the $V_{BD}$ at more p-type charge with premature breakdown at the drain edges and drain finger-tips has increased by more than 200 V compared to the device without the diluted regions, if measured under equal conditions.

In representative embodiments, a combination of local mask-diluted implantation, extra field-plate and stretching to a larger drift-length at the finger-tips usefully improve $V_{bd}$ by reducing local electric field concentrations. Comparable measures have been taken at the source finger-tip, resulting in an improved breakdown voltage at more n-type charge balance as shown in FIG. 6.

A further advantage of the dilution of the dope in the second region (RP) is the slight increase in net n-type charge at the drain side. This is advantageous for good on-state behavior at high voltages, which normally can be hampered by the occurrence of the known Kirk effect. This happens because of the charge of the current-carrying electrons adds to the charge balance for the RESURF spread of potential lines.

In connection with illustrative embodiments, high voltage semiconductor devices and methods of fabricating the devices are described. One of ordinary skill in the art appreciates that many variations that are in accordance with the present teachings are possible and remain within the scope of the appended claims. These and other variations would become clear to one of ordinary skill in the art after inspection of the specification, drawings and claims herein. The invention therefore is not to be restricted except within the spirit and scope of the appended claims.

The invention claimed is:

1. A method of manufacturing an extended drain of a high voltage field-effect (HVFET) transistor, the method comprising:
   a) implanting a first dopant in a substrate of a first conductivity type to form a first region of a second conductivity type in the substrate;
   b) providing a mask having an open portion over a center portion of the substrate, and a plurality of outer open portions and blocking portions disposed over the substrate between the center portion and an edge of the substrate;
   c) implanting with the mask a second dopant into the substrate at a surface to form a second region of the first conductivity type, the second region having a region of reduced doping concentration of the implanted second dopant between the center portion and the edge;
   d) forming an epitaxial layer of the first conductivity type on the surface, wherein the surface is covered by the first epitaxial layer; and
   e) implanting the epitaxial layer with a third dopant and forming a third region of the second conductivity type in the epitaxial layer, wherein this third region forms a pn junction with the second region.

2. A method as claimed in claim 1, wherein the plurality of outer open portions and blocking portions further comprise a plurality of outer open portions and a plurality of blocking portions of a selected geometric shape disposed over the substrate.

3. A method as claimed in claim 2, wherein the geometric shape further comprise one of: a line, a polygon, a square, a rectangle, a triangle or an ellipse.

4. A method as claimed in claim 1, wherein the reduced dopant concentration is reduced substantially non-linearly between the center and the edge.

5. A method as claimed in claim 1, wherein the reduced dopant concentration is reduced substantially linearly between the center and the edge.

6. A method as claimed in claim 1, wherein the plurality of outer open portions and blocking portions are disposed at least partly over fingertips of the HVFET.

7. A method as claimed in claim 1, wherein the plurality of outer open portions and blocking portions are disposed at least partly over extensions of the HVFET.

8. A method as claimed in claim 6, wherein the fingertips are source fingertips.

9. A method as claimed in claim 6, wherein the finger-tips are drain fingertips.

10. A method as claimed in claim 7, wherein the extensions are drain extensions.

11. A method as claimed in claim 1, wherein the mask is provided on the surface of the substrate and the second dopant is implanted through the mask to form the second region.

12. A method as claimed in claim 11, wherein the epitaxial layer is formed on the surface of the substrate after the formation of the first and second regions.

13. A method as claimed in claim 11, wherein the second dopant is implanted into the first region and the second region is formed from a part of the first region.

14. A method as claimed in claim 11, wherein the epitaxial layer is formed on at least the second region, the second region being covered by the epitaxial layer.

15. A method as claimed in claim 11, wherein the reduced dopant concentration is reduced substantially non-linearly between the center portion and the edge.

16. A method as claimed in claim 11, wherein the reduced dopant concentration is reduced substantially linearly between the center portion and the edge.

17. A method as claimed in claim 11, wherein the plurality of outer open portions and blocking portions are disposed at least partly over fingertips of the HVFET.

18. A method as claimed in claim 17, wherein the fingertips are source fingertips.

19. A method as claimed in claim 17, wherein the fingertips are drain fingertips.

20. A method as claimed in claim 11, wherein the plurality of outer open portions and blocking portions are disposed at least partly over drain extensions of the HVFET.

* * * * *